(12) United States Patent
Kozakai

(10) Patent No.: US 7,750,318 B2
(45) Date of Patent: Jul. 6, 2010

(54) WORKING METHOD BY FOCUSED ION BEAM AND FOCUSED ION BEAM WORKING APPARATUS

(75) Inventor: Tomokazu Kozakai, Chiba (JP)

(73) Assignee: SII Nanotechnology Inc. (JP)

( * ) Notice: Subject to any disclaimer, the term of this patent is extended or adjusted under 35 U.S.C. 154(b) by 212 days.

(21) Appl. No.: 11/918,171

(22) PCT Filed: Apr. 17, 2006

(86) PCT No.: PCT/JP2006/307987

§ 371 (c)(1),
(2), (4) Date: Nov. 26, 2007

(87) PCT Pub. No.: WO2006/115090

PCT Pub. Date: Nov. 2, 2006

(65) Prior Publication Data

US 2008/0302979 A1    Dec. 11, 2008

(30) Foreign Application Priority Data

Apr. 22, 2005    (JP) .............................. 2005-124942

(51) Int. Cl.
*A61N 5/00*    (2006.01)
*G21G 5/00*    (2006.01)

(52) U.S. Cl. ................. 250/492.1; 250/492.2; 250/310; 250/306; 250/252.1; 250/309

(58) Field of Classification Search ............ 250/492.1, 250/492.2, 310, 306, 309, 252.1
See application file for complete search history.

(56) References Cited

FOREIGN PATENT DOCUMENTS

| JP | 60074249 | 4/1985 |
|----|----------|--------|
| JP | 2002184342 | 6/2002 |

*Primary Examiner*—Jack I Berman
*Assistant Examiner*—Meenakshi S Sahu
(74) *Attorney, Agent, or Firm*—Adams & Wilks

(57) ABSTRACT

A first working process performs a deposition working or an etching working to a workpiece by face-irradiating a focused ion beam to the workpiece, and a second working process then performs a deposition working or an etching working to the workpiece by edge-irradiating a focused ion beam to an edge of the workpiece. During the first working process, the deposition working or the etching working is performed to add the missing portion or remove the excess portion to a point slightly short of the edge boundary of the workpiece, i.e., to a point that is less than the irradiation width of the focused ion beam. The remaining missing portion or the remaining excess portion is eliminated in the second working process by edge-irradiating the focused ion beam to the edge of the workpiece.

4 Claims, 6 Drawing Sheets

WORKING METHOD BY FOCUSED ION BEAM AND FOCUSED ION BEAM WORKING APPARATUS

BACKGROUND OF THE INVENTION

CROSS-REFERENCE TO RELATED APPLICATIONS

This application is a U.S. national stage application of International Application No. PCT/JP2006/307987, filed Apr. 17, 2006, claiming a priority date of Apr. 22, 2005, and published in a non-English language.

TECHNICAL FIELD

The present invention is one relating to a working method by focused ion beam and a focused ion beam working apparatus.

BACKGROUND ART

From olden times, there is provided a working method of repairing a photomask of semiconductor device, or the like by using a focused ion beam (Focused Ion Beam) working apparatus (for example, refer to Patent Document 1). In this disclosed working method, an ion beam emitted from an ion source is made the focused ion beam through an ion optical system (possessing a condenser lens, a blanking electrode, an aligner electrode, an aperture, an objective lens, and the like), and it is irradiated to the photomask of the semiconductor device desired to be worked (refer to FIG. 4 of the Patent Document 1). And, by blowing a gas together with this irradiation of the focused ion beam, the photomask of this semiconductor device is deposition-worked or etching-worked. In olden times, when applying a deposition working or an etching working of a predetermined pattern by using a focused ion beam apparatus, the working is implemented by dividing a region worked to the predetermined pattern into micro regions (pixels), and irradiating the focused ion beam to each of the divided pixels. And, at this time, the irradiation of the focused ion beam is performed such that a dose quantity of the focused ion beam to be irradiated becomes the same for each of the micro pixels by adjusting a scanning frequency, or the like.

Patent Document 1: JP-A-2002-184342 Gazette

In this working method by focused ion beam, which is provided from olden times, the following issue is left for instance. For example, as shown in FIG. 6(a), in a method of etching-working a convex part 101 of such a shape as to spread from a photomask pattern 100 toward a base by dividing it into the micro pixels like the above and scanning the focused ion beam to each of the divided pixels, there is the fact that, as shown in FIG. 6(b), one part 102 of the micro base is left while deviating from a worked area F. In order to etching-work so as to become the same face as an edge line 103 of the pattern 100 by removing this one part 102 of the base, it is demanded to irradiate the focused ion beam capable of being irradiated like a spot to this left one part 102 of the base. In other words, it is required to use the focused ion beam whose irradiation width is coincided with this left one part 102 of the base. However, there are issues that there is a technical limit in obtaining the focused ion beam having a micro beam diameter corresponding to this irradiation width, and that it is also impossible to make the irradiation width into one pixel or smaller in order to etch only this one part 102 of the base.

The present invention is one made in view of the circumstances like these, and its object is to provide a working method by focused ion beam and a focused ion beam working apparatus, which can, even in a case where it is one like a opaque defect portion extending from a normal pattern in the photomask of the semiconductor device, and one whose size is smaller than the irradiation width of the focused ion beam, desirably work its place desired to be worked.

SUMMARY OF THE INVENTION

As means for solving the above problems, the present invention provides a working method by focused ion beam and a focused ion beam working apparatus, which are mentioned below.

A working method by focused ion beam of the present invention is a working method by focused ion beam, which performs a deposition working or an etching working to a work piece by irradiating the focused ion beam to the work piece, and characterized in that the work piece is deposition-worked or etching-worked by irradiating the focused ion beam to an edge of the work piece, and controlling a dose quantity of the focused ion beam.

In the working method by focused ion beam of the present invention, the focused ion beam is irradiated to an edge made a corner part within an end part of the work piece. This edge irradiation is one meaning an irradiation irradiating the focused ion beam to the edge made the end part of a desired working place of the work piece. At this time, as the dose quantity is increased by irradiating the focused ion beam to the edge, a region to be worked gradually spreads from the edge. In other words, by controlling the dose quantity of the focused ion beam to be irradiated, its working quantity can be finely controlled.

Accordingly, even in a case where the irradiation width of the focused ion beam is large, if this focused ion beam is irradiated to the edge of the work piece, it is possible to deposition-work or etching-work a region smaller than the irradiation width of the work piece with a good controllability.

A working method by focused ion beam of the present invention is characterized by including a first working process performing a deposition working or an etching working to the work piece by face-irradiating the focused ion beam to an actual working range entering inside an edge part of a working range of the work piece, and a second working process performing the deposition working or the etching working to the work piece by edge-irradiating one part of the focused ion beam to an edge of an edge part or an edge part vicinity, which is left in the work piece after the first working process.

In the working method by focused ion beam of the present invention, first, in the first working process, there is prepared a bit map of the actual working range entering inside the edge part of the working range of the work piece, and all of the focused ion beam is irradiated to a place coincided with this bit map and made an upper face. This face irradiation is one meaning an irradiation irradiating the focused ion beam to the upper face of a desired working place of the work piece, and one performing the deposition working or the etching working along a direction of this ion beam. In a case where the focused ion beam is irradiated like this, the deposition working or the etching working is performed along the actual working range like a normal. Incidentally, since this actual working range is made the range entering inside the edge part of the working range of the work piece, in the edge part or the edge part vicinity, there is made one in which the deposition working or the etching working is not performed intact. And, there shifts to the second working process described below.

In this second working process, the deposition working or the etching working is performed to the work piece by edge-irradiating the focused ion beam to the edge of the edge part or the edge part vicinity, which is left in the work piece. This edge part means a place, in which the working finally finishes, within the desired working place of the work piece. In other words, in this second working process, the edge part becomes a final point when the deposition working or the etching working is performing by edge-irradiating. And, the inside of this edge part means the fact that it is a side reverse in direction to a working direction in the second working process.

Here, in the edge part or the edge part vicinity, which is left, since the deposition working or the etching working is performed by edge-irradiating the focused ion beam, the worked face becomes one liable to be working-adjusted as mentioned above. Further, although the edge part or the edge part vicinity, which is left, is one smaller than the irradiation width of the focused ion beam, if this focused ion beam is irradiated to the edge of the work piece, it is possible to deposition-work or etching-work the edge part or the edge part vicinity, which is left, with the good controllability without decreasing this irradiation width of the focused ion beam.

Further, in a case where, in a focused ion beam working apparatus performing a deposition working or an etching working to a work piece by irradiating a focused ion beam to the work piece, there is provided such a control means as mentioned above which controls so as to perform the deposition working or the etching working to the work piece by performing the deposition working or the etching working to the work piece by face-irradiating the focused ion beam to an actual working range entering inside an edge part of a working range of the work piece, and subsequently edge-irradiating the focused ion beam to an edge of an edge part left in the work piece after the first working, there can be made the focused ion beam working apparatus bringing about such actions as mentioned above.

A working method by focused ion beam of the present invention is characterized in that an ion dose total quantity of the focused ion beam to be irradiated is set while corresponding to a working quantity of the edge of the work piece. Incidentally, this working quantity that the focused ion beam works the work piece is one depending on the total quantity of the ion dose contained in the focused ion beam to be irradiated to the work piece.

In the working method by focused ion beam of the present invention, the ion dose total quantity of the focused ion beam to be irradiated is set in conformity with the working of the edge of the work piece, in other words, in conformity with a desired quantity with which this edge is desirably worked. By this, this edge of the workpiece is desirably deposition-worked or etching-worked by a desired quantity. More additionally, in a case where this dose quantity per unit time of the focused ion beam is decreased as the ion dose total quantity approaches to an ion dose total quantity conforming to a desired working quantity, a working place of this work piece can be finished with a better precision.

A working method by focused ion beam of the present invention is characterized in that the focused ion beam is constituted by a pulse made a predetermined dose quantity, and the pulse is continued to be irradiated till becoming the ion dose total quantity.

In the working method by focused ion beam of the present invention, since the focused ion beam is constituted by the pulse whose dose quantity is made the previously determined quantity, and the focused ion beam is irradiated by this pulse till becoming the ion dose total quantity in conformity with a desired quantity with which the edge is desirably worked, if a frequency of this pulse to be irradiated is controlled, this focused ion beam can be made an ion dose total quantity capable of desirably working. Accordingly, by the irradiation frequency of the pulse, since there can be adjusted to the ion dose total quantity capable of desirably working, it is possible to desirably control an irradiation quantity of the focused ion beam. More additionally, in a case where this pulse is irradiated to the work piece continuously in a commencement of the irradiation and with a suitable time interval being inserted as becoming near the ion dose total quantity, the working place of this work piece can be finished with the good precision.

According to the working method by focused ion beam and the focused ion beam working apparatus, which are concerned with the present invention, even in a case where the place desired to be worked is one smaller than the irradiation width of the focused ion beam, that place desired to be worked can be worked with the good precision.

DETAILED DESCRIPTION OF THE INVENTION

Figure 1:
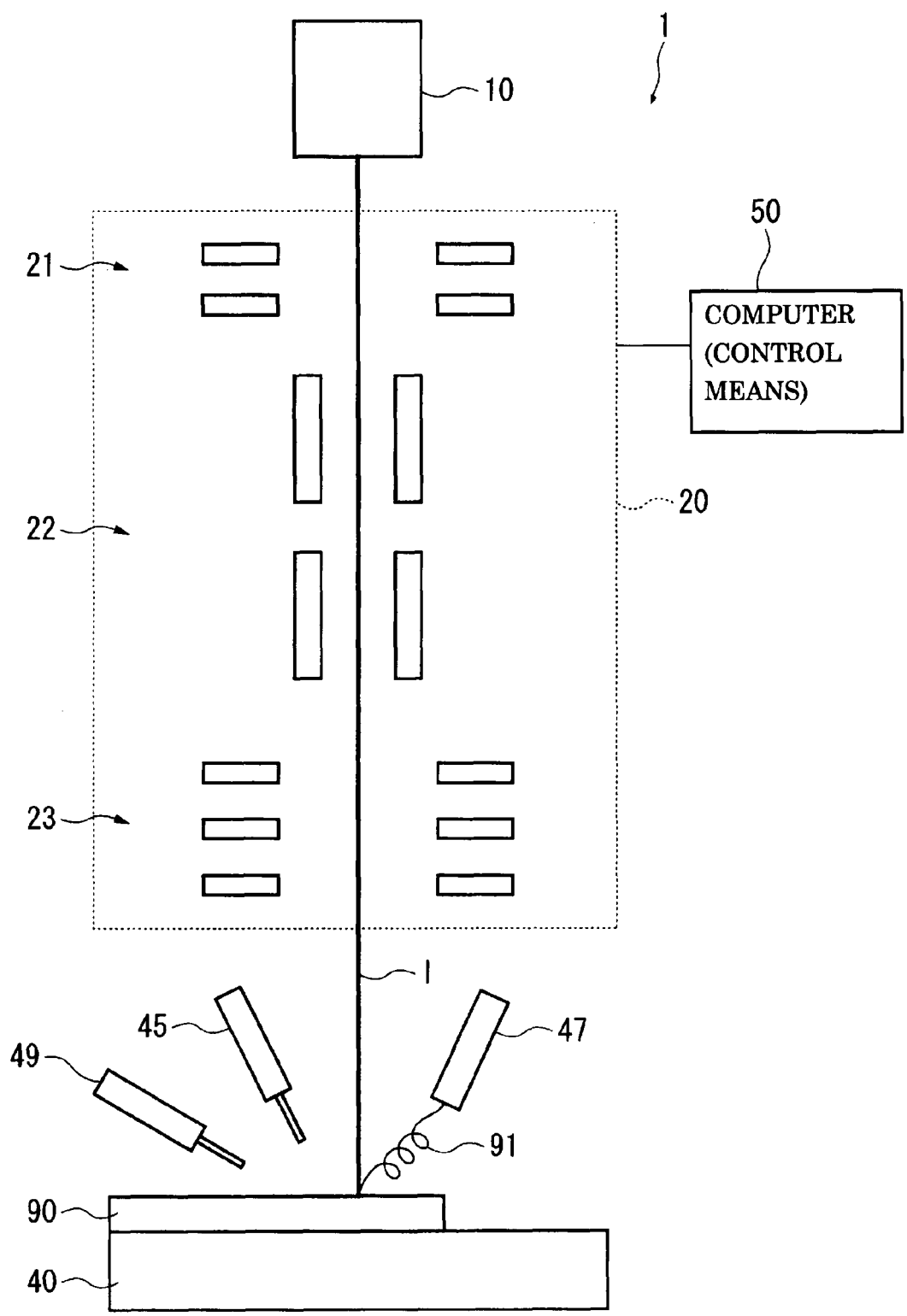
FIG. 1 is a schematic diagram of an ion beam working apparatus concerned with the present invention.

Hereunder, as to embodiments about a focused ion beam working apparatus and a working method by this focused ion beam working apparatus, which are concerned with the present invention, there are explained while referring to the drawings. FIG. 1 is a schematic diagram of an ion beam working apparatus concerned with the present invention, FIG. 2 a view showing a working place by a bit map, FIG. 3 a view showing a first working process, FIG. 4 a view showing a second working process, and FIG. 5 a graph showing a relation between a dose quantity and a movement quantity (worked quantity of a work piece) of an edge.

A reference numeral 1 shown in the block diagram of FIG. 1 is a focused ion beam working apparatus concerned with the present invention, and one working a work piece 90 including the photomask of the semiconductor device in which a pattern comprising Cr or MoSi is formed on a substrate comprising $SiO_2$. This focused ion beam working apparatus 1 is constituted basically by an ion source 10 generating an ion beam I, an ion optical system 20 focussing this ion beam, and a stage 40 supporting the work piece and possessing an XY-movement mechanism. Additionally, in this focused ion beam working apparatus 1, there are provided a gas gun 45 shooting toward the work piece 90 supported by the stage 40, a charged particle detector 47 detecting a secondary charged particle 91 generating from the work piece 90, and a neutralizer 49 neutralizing the charged work piece 90. Incidentally each of the ion source 10, the ion optical system 20, the gas gun 45, the charged particle detector 47 and the neutralizer 49 is connected to a computer (control means) 50 and, by this computer 50, a suitable control is performed.

The ion source 10 is a source generating the ion beam I (refer to FIG. 4), and a gallium ion made a liquid metal is used for instance. This gallium ion is easy to be designed as the ion source from a reason that its melting point is low, or the like, and desirable as a selection of the ion source 10. Additionally, in the ion optical system 20 focussing the ion beam I generating from the ion source 10, there are included a condenser lens 21 for focussing the ion beam I generated in the ion source 10, a blanking electrode 22 deflecting the beam in order that the ion beam I is not irradiated to the work piece 90, the condenser lens 21 forming an electric field to thereby focus the ion beam I, an objective lens 23 focussing the focused ion beam I to a desired working place of the work piece 90, and the like. Further, although not shown in the drawing, it has also a deflector deflection-scanning the focused ion beam. Incidentally, in the ion optical system 20, depositions of these may be suitably altered, and it may be one in which there are additionally provided suitable aligner, aperture and the like. Further, the focused ion beam I that the focused ion beam working apparatus 1 generates and irradiates to the work piece 90 is constituted by pulses, and one pulse is set to a predetermined dose quantity.

The gas gun 45 is one blowing a gas toward a desired deposition working place of the work piece 90 when performing a deposition working by irradiating the focused ion beam I, and possesses a suitable nozzle, thereby blowing a suitable gas forming a deposition film. The charged particle detector 47 detects the secondary charged particle 91 generating from the work piece 90 in a case where the focused ion beam I is irradiated to and scanned on the workpiece 90. The neutralizer 49 is one neutralizing the work piece 90 charged by the fact that the focused ion beam I is irradiated, and constituted by an electron gun irradiating an electron beam, or the like. The stage 40 is one mounting and supporting the work piece 90 and, though not shown in the drawings, in it, there is provided a movement mechanism movable in an XY-direction, which constitutes a two-dimension while intersecting perpendicularly to each other.

Further, the computer 50 possesses a control section, a storage section, an input section, a display section, and the like. This computer 50 displays an image of the work piece 90 on the basis of a signal from the charged particle detector 47 detecting the secondary charged particle 91 generating when the focused ion beam I is scan-irradiated to the work piece 90, besides it controls each part of the focused ion beam working apparatus 1. Further, on the basis of information of the image concerned, the computer 50 prepares a bit map M in which a pattern working region of the work piece 90 is divided into micro regions (pixels).

The focused ion beam working apparatus 1 constituted like this works the work piece 90 as follows by irradiating the focused ion beam I to the work piece 90. Incidentally, on occasion of the working like this, each part constituting the above-mentioned focused ion beam working apparatus 1 becomes one controlled by the computer 50 and, in that control, there are included a first working process and a second working process. Incidentally, FIG. 2(*a*) and FIG. 3(*a*) are drawings relating to a deposition working, and FIG. 2(*b*) and FIG. 3(*b*) drawings relating to an etching working.

Figure 2A:
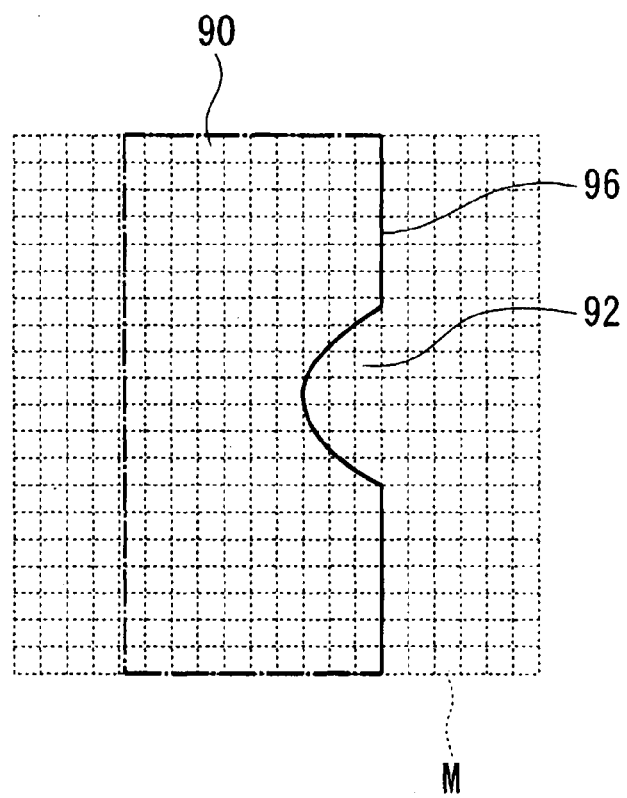
FIG. 2 is a view showing a working place by a bit map.
Figure 2B:
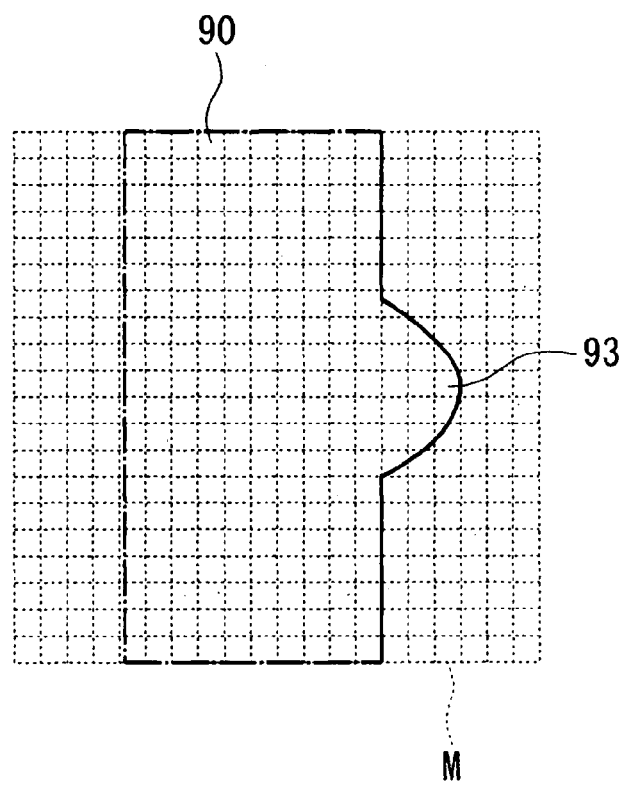

In the first working process, first, a range entering inside an edge part of a working range of the work piece 90 is determined as an actual working range in which the working is actually performed in the first working process, thereby preparing the bit map M about this actual working range. Concretely, first, as shown in FIG. 2(*a*) and FIG. 2(*b*), the focused ion beam I is scan-irradiated to the work piece (photomask pattern) 90 by the ion source 10 and the ion optical system 20. As shown also in FIG. 1, in a case where the focused ion beam I is irradiated to the work piece 90, the secondary charged particle 91 generates from this work piece 90. This generated secondary charged particle 91 is detected by the charged particle detector 47 and, on the basis of an intensity of the detected secondary charged particle 91 of this secondary charged particle 91 and position information of the ion beam I, the computer 50 performs an imaging processing of the work piece 90. On the basis of this image information, the computer 50 prepares the bit map M of the work piece 90. That is, as shown in FIG. 2(*a*) and FIG. 2(*b*), there is formed the bit map M in which the work piece 90 is mapped in a predetermined range unit. Incidentally, a concave part 92 in FIG. 2(*a*) becomes a desired place in which it is desired to perform the deposition working, a convex part 93 in FIG. 2(*b*) becomes a desired place in which it is desired to perform the etching working, and the deposition working or the etching working is performed in order that the concave part 92 or the convex part 93 is flattened in the same plane as an edge part 96 of the work piece (photomask pattern) 90.

Further, as shown in FIG. 3(*a*) and FIG. 3(*b*), there is made one in which a focused ion beam irradiation point B is irradiated for every unit range of the bit map M shown in FIG. 2. As shown in FIG. 3(*a*) and FIG. 3(*b*), a length of a spacing between the focused ion beam irradiation points becomes W1. The workpiece 90 becomes one desirably worked by the irradiation of this ion beam I.

After the bit map M is prepared like this, subsequently the focused ion beam working apparatus 1 scans the focused ion beam I to each pixel position in order while coinciding with this bit map M, thereby face-irradiating each pixel position. This face irradiation is one meaning an irradiation in which the focused ion beam I is irradiated to an upper face of a desired working place of the work piece 90 such that the ion beam I is irradiated to each of the unit range of the prepared bit map M, and one performing the deposition working or the etching working along a direction of this ion beam. That is, in the deposition working in the first working process, there is made one in which the deposition film is gradually laminated by scan-irradiating the focused ion beam I to each pixel position of the concave part 92 while supplying a gas for the deposition from the gas gun 45, and buried till a slight inside in which all the concave part is buried. Further, in the etching working in the first working process, there is made one in which the convex part 93 is gradually cut by scan-irradiating the focused ion beam I, and cut till a slight inside from a boundary line of a set working region. Thus in the first working processing, the focused ion beam I is scan-irradiated in a working range that does not overlap the work piece edge C by a distance smaller than the irradiation width W1 of the focused ion beam.

By doing like this, it follows that, in the deposition working, a slight, micro concave part (missing portion) 94 is left at an edge part or an edge part vicinity as shown in FIG. 3(*a*) and, in the etching working, a slight, micro convex part (excess portion) 95 is left at the edge part or the edge part vicinity as shown in FIG. 3(*b*). As shown in FIG. 4(*a*) and FIG. 4(*b*), a length of a width in a micro part of each of the micro concave part 94 and the micro convex part 95, which are left slightly, becomes W2. As shown in the drawing, this length W2 of the micro part becomes small in comparison with the length W1 of the above-mentioned spacing between the focused ion beam irradiation points, i.e., the length W2 is smaller than the irradiation width W1 of the focused ion beam I. Further, each of the micro concave part 94 and the micro convex part 95, which are left slightly, becomes a place finally worked among the desired working places of the work piece. By doing like this, the first working process is finished, and subsequently there shifts to the second working process.

Figure 3A:
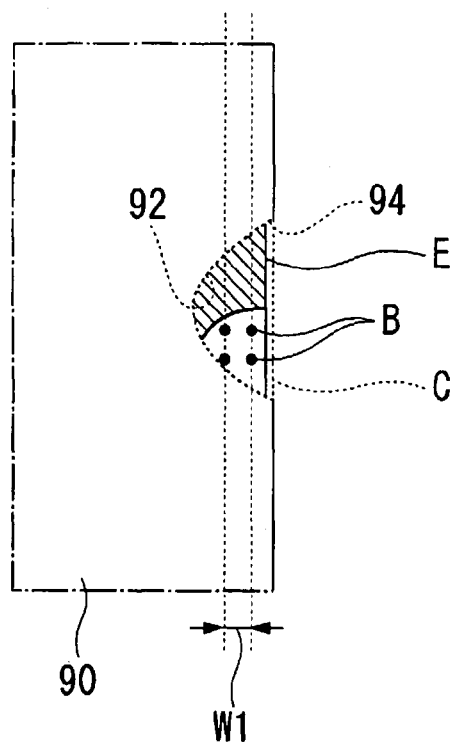
FIG. 3 is a view showing a first working process.
Figure 3B:
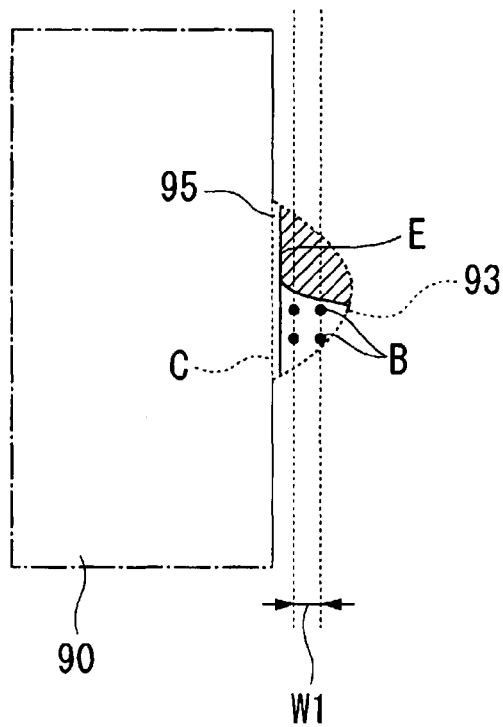

In this second working process, as shown in FIG. 3(a), in the deposition working, the micro concave part (missing portion) 94 left slightly in the above-mentioned first working process is additionally deposition-worked. Further, in the etching working, as shown in FIG. 3(b), the micro convex part (excess portion) 95 left slightly in the above-mentioned first working process is additionally etching-worked. Concretely, in this second working process, the focused ion beam I is edge-irradiated to an edge E made a corner part of an end part of the micro concave part 94 shown in FIG. 4(a) or the micro convex part 95 shown in FIG. 4(b). This edge irradiation is one meaning, while differing from the above-mentioned face irradiation, an irradiation irradiating the focused ion beam I to the edge E that is an end part of the desired working place of the work piece, and one performing the deposition working or the etching working by irradiating the focused ion beam I to the edge E. Incidentally, a sign C in FIG. 3(a) and FIG. 3(b), and FIG. 4(a) and FIG. 4(b) is a place corresponding to an edge part in the present invention, and this edge part C means a place in which the working finally finishes within the desired working place of the work piece 90. In other words, in this second working process, the edge part C becomes a final point in performing the deposition working or the etching working by edge-irradiating.

Further, the focused ion beam I irradiated in this second working process becomes one whose dose quantity is controlled. That is, there becomes one whose dose quantity can be arbitrarily selected in conformity with the micro concave part 94 or the micro convex part 95, which is left in the above-mentioned first working process. This dose quantity is one determined by a product of an electric current quantity and an irradiation time of the focused ion beam, and one deduced as a physical quantity corresponding to the irradiation time if the electric current quantity of the focused ion beam is stable one. Incidentally, this focused ion beam I may be constituted by pulses set to a predetermined electric current quantity of the focused ion beam. In this case, the dose quantity to be irradiated becomes one determined by a frequency of the pulses to be irradiated.

And, a working quantity of the deposition working or the etching working becomes one depending on the dose quantity of the focused ion beam I to be irradiated. In other words, as shown in a graph of FIG. 5, which shows a relation between the dose quantity and a movement quantity of the edge (in other words, a quantity with which a position of the edge moves by the fact that a region gradually worked spreads from the edge), as the dose quantity increases also the movement quantity of the worked edge increases. Concretely, in a case where the dose quantity of the focused ion beam I is 400 CST (CST: a certain unit proportional to the dose quantity), the movement quantity of the edge becomes 3.5 nm and, in a case where the dose quantity of the focused ion be an B is 500 CST, the movement quantity of the edge becomes one near 11 nm.

Incidentally, this movement quantity of the edge is made the same as the working quantity that the focused ion beam I works. In the second working process, since the dose quantity in regard to the movement quantity of the edge is previously measured like this FIG. 5, in a case working this edge, it is possible to irradiate the focused ion beam I corresponding to a dose quantity for obtaining a desired edge movement quantity. In other words, it is possible to arbitrarily select and set the dose quantity in view of the above-mentioned working quantity of the micro concave part 94 or the micro convex part 95 and, by this, the working can be performed with a good precision.

Figure 4A:
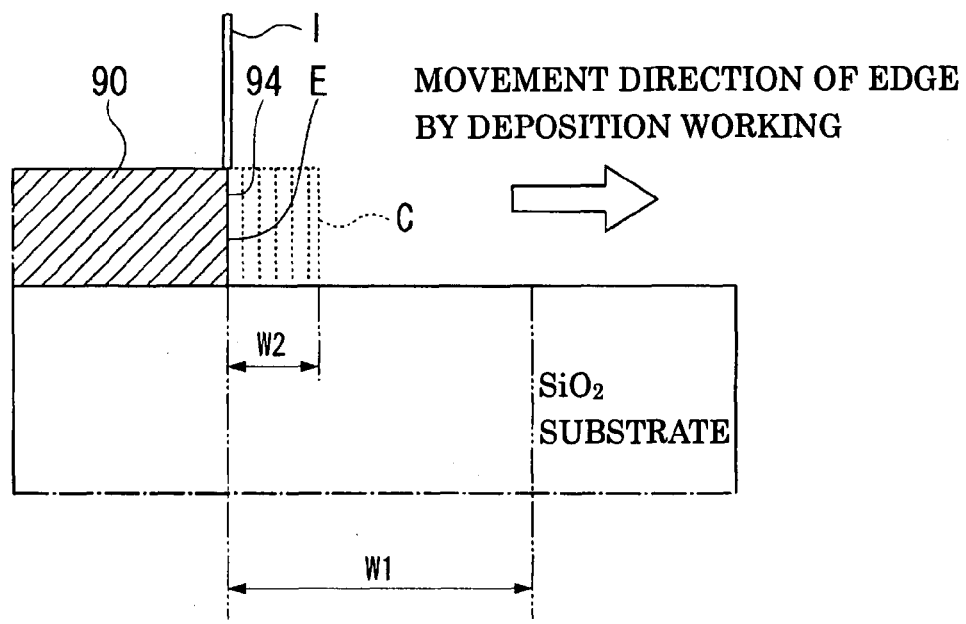
FIG. 4 is a view showing a second working process.
Figure 4B:
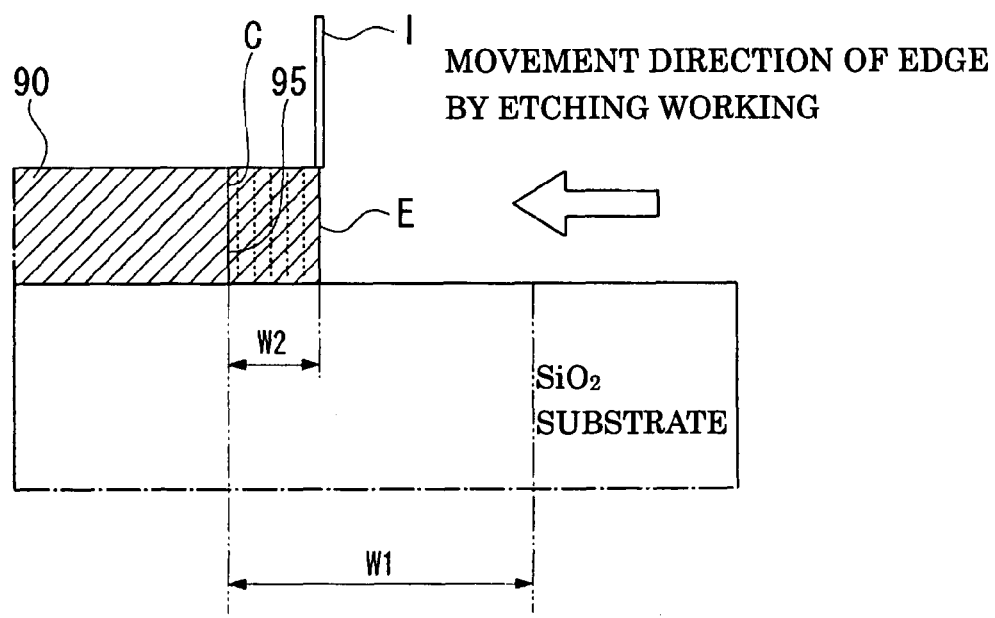
Figure 5:
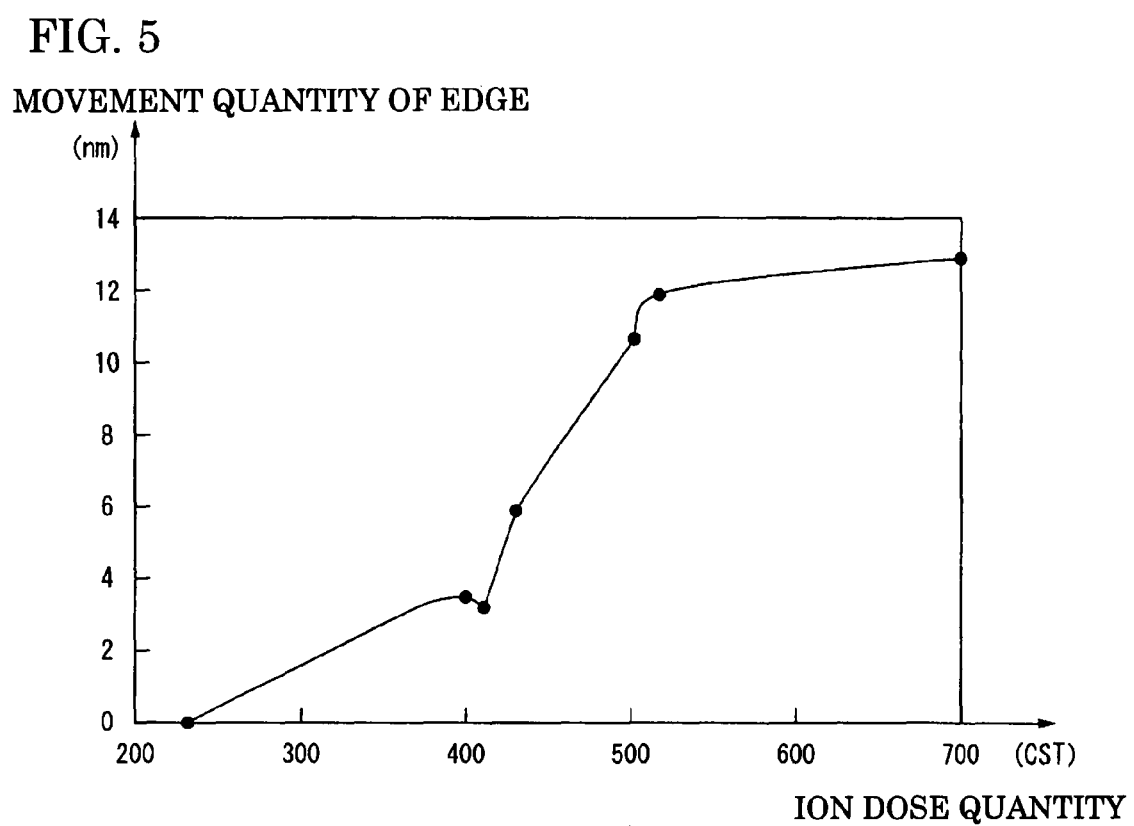
FIG. 5 is a graph showing a relation between a dose quantity and a movement quantity (worked quantity of a work piece) of an edge.
Figure 6A:
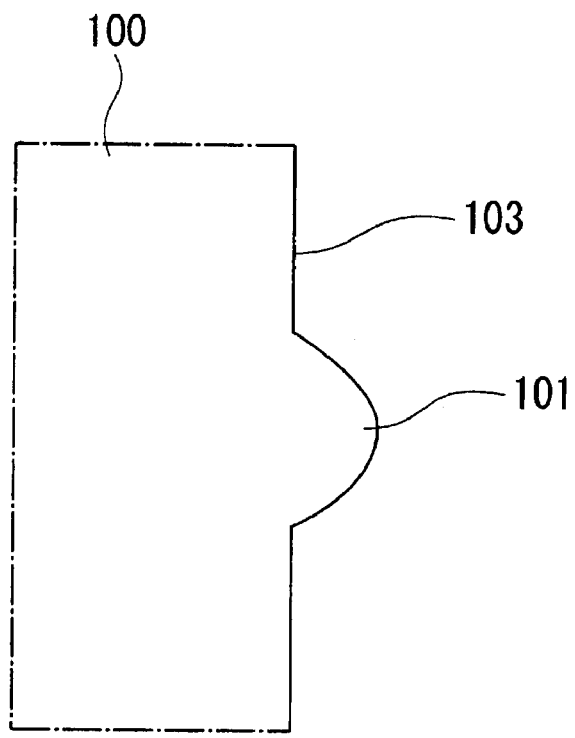
FIG. 6 is a view showing an example worked by a conventional working method by ion beam.
Figure 6B:
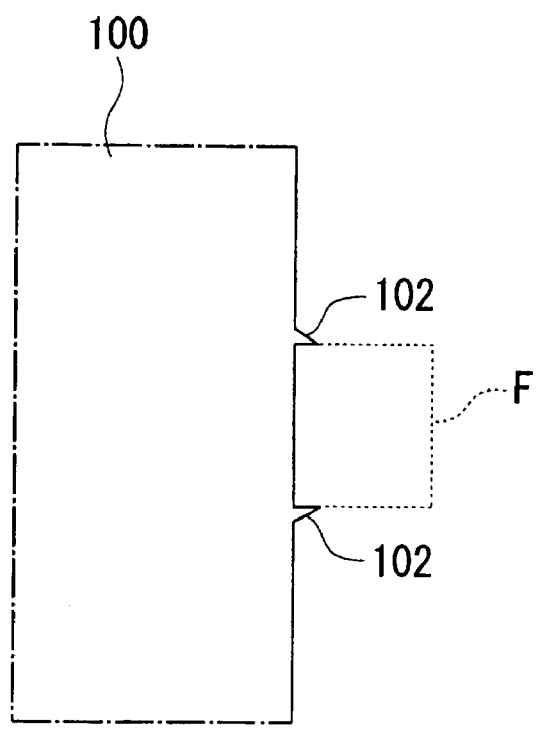

The focused ion beam I whose dose quantity is selected and set like this is irradiated to the edge E near the edge part C in regard to the work piece 90 as shown in FIG. 4(a) and FIG. 4(b). By doing so, in the deposition working of FIG. 4(a), the deposition film is gradually formed in this edge E, and this micro concave part 94 becomes buried one. In other words, by this deposition working, the deposition film is gradually formed in the edge E toward a right in the drawing, and this micro concave part 94 is buried. Further, in the etching working of FIG. 4(b), this edge E is gradually cut, and this micro convex part 95 becomes removed one. In other words, by this etching working, the edge E is gradually cut toward a left in the drawing, and this micro concave part 94 is removed. By doing like this, even in a case where a place, in which it is desired to perform the working, is one whose width is smaller than the irradiation width of the focused ion beam I, it is possible to desirably work the place in which it is desired to perform the working.

Incidentally, a technical scope of the present invention is not one limited to the above embodiment, and it is possible to add various modifications in a scope not deviating from a gist of the present invention. For example, in the above-mentioned embodiment, although the focused ion beam is constituted by the pulses made the predetermined dose quantity, there is not limited to this, and it is also possible to continuously irradiate the focused ion beam and adjust the dose quantity by its irradiation time. Further, although the gallium ion is used as the ion source, there is not limited to this, and it is possible to use a suitable ion source. Further, also as to the work piece, it is not one limited to the photomask, and it is possible to work a suitable work piece constituted very small.

INDUSTRIAL APPLICABILITY

Even in the case where it is one like the opaque defect portion extending from the normal pattern in the photomask of the semiconductor device, and one whose size is smaller than the irradiation width of the focused ion beam, it is possible to desirably work its place desired to be worked.

The invention claimed is:

1. A working method which performs a deposition working or an etching working to a workpiece by irradiating a focused ion beam to the workpiece, comprising:
  a first working process performing a deposition working or an etching working to the workpiece by face-irradiating the focused ion beam to an actual working range entering inside an edge part of a working range of the workpiece, and
  a second working process performing the deposition working or the etching working to the workpiece by irradiating the focused ion beam to an edge of an edge part or an edge part vicinity, which is left in the workpiece after the first working process and which is smaller than the irradiation width of the focused ion beam.

2. A focused ion beam working apparatus that performs a deposition working or an etching working to a workpiece by irradiating a focused ion beam to the workpiece, comprising:
  scanning means for scanning a focused ion beam on a workpiece; and
  control means for controlling the scanning means to perform a deposition working or an etching working to the workpiece by face-irradiating the focused ion beam to an actual working range entering inside an edge part of a working range of the workpiece, and subsequently controlling a dose quantity of the focused ion beam by irradiating the focused ion beam to an edge of an edge part which is left in the workpiece after the first working and which is smaller than the irradiation width of the focused ion beam.

3. A working method of deposition processing or etching processing a workpiece using a focused ion beam, the method comprising the steps:

providing a workpiece that has a missing portion which extends inwardly from an edge of the workpiece or that has an excess portion which extends outwardly from an edge of the workpiece;

performing a first deposition processing or a first etching processing to the workpiece by face-irradiating a focused ion beam onto the workpiece and scanning the focused ion beam in a working range that does not overlap the workpiece edge by a distance smaller than the irradiation width of the focused ion beam so that a part of the missing portion or a part of the excess portion remains along the workpiece edge; and thereafter performing a second deposition processing or a second etching processing to the workpiece by edge-irradiating a focused ion beam onto the workpiece edge and scanning the focused ion beam to eliminate the remaining missing portion or the remaining excess portion along the workpiece edge.

4. A working method according to claim 3; further including a step of controlling the dose quantity of the focused ion beam during the step of performing the second deposition processing or etching processing.

* * * * *